United States Patent
Liu et al.

(10) Patent No.: US 10,580,780 B2
(45) Date of Patent: Mar. 3, 2020

(54) SEMICONDUCTOR STRUCTURE AND METHOD OF FORMING THE SAME

(71) Applicant: United Microelectronics Corp., Hsinchu (TW)

(72) Inventors: Zi-Jun Liu, Kaohsiung (TW); Ping-Chia Shih, Tainan (TW); Chi-Cheng Huang, Kaohsiung (TW); Kuo-Lung Li, Yunlin County (TW); Hung-Wei Lin, Kaohsiung (TW); An-Hsiu Cheng, Pingtung County (TW); Chih-Hao Pan, Kaohsiung (TW); Cheng-Hua Chou, Kaohsiung (TW); Chih-Hung Wang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 16/005,422

(22) Filed: Jun. 11, 2018

(65) Prior Publication Data
US 2019/0378846 A1  Dec. 12, 2019

(51) Int. Cl.
| | |
|---|---|
| *H01L 23/62* | (2006.01) |
| *H01L 27/112* | (2006.01) |
| *H01L 27/11521* | (2017.01) |
| *H01L 27/1156* | (2017.01) |
| *H01L 21/762* | (2006.01) |
| *H01L 21/3115* | (2006.01) |
| *H01L 21/311* | (2006.01) |
| *H01L 21/28* | (2006.01) |

(52) U.S. Cl.
CPC .. *H01L 27/11206* (2013.01); *H01L 21/76224* (2013.01); *H01L 27/1156* (2013.01); *H01L 27/11521* (2013.01); *H01L 21/3115* (2013.01); *H01L 21/31116* (2013.01); *H01L 29/40114* (2019.08)

(58) Field of Classification Search
CPC .... H01L 23/525; H01L 23/5256; H01L 23/62
See application file for complete search history.

(56) References Cited

U.S. PATENT DOCUMENTS

| | | | |
|---|---|---|---|
| 7,759,766 B2 | 7/2010 | Booth, Jr. et al. | |
| 7,923,811 B1 * | 4/2011 | Im | H01L 23/5256 257/209 |
| 8,026,573 B2 | 9/2011 | Kuo et al. | |
| 8,071,437 B2 | 12/2011 | Lin et al. | |
| 8,772,907 B1 | 7/2014 | Ho | |
| 2002/0113291 A1 * | 8/2002 | Adkisson | H01L 23/3735 257/529 |
| 2010/0295133 A1 * | 11/2010 | Kim | H01L 28/20 257/380 |
| 2012/0178234 A1 * | 7/2012 | Lee | H01L 27/0629 438/382 |

(Continued)

*Primary Examiner* — Jae Lee
(74) *Attorney, Agent, or Firm* — J.C. Patents (57) ABSTRACT

Provided is a semiconductor structure including a substrate, an isolation structure, a fuse and two gate electrodes. The isolation structure is located in the substrate and defines active regions of the substrate. The fuse is disposed on the isolation structure. The gate electrodes are disposed on the active regions and connected to ends of the fuse. In an embodiment, a portion of a bottom surface of the fuse is lower than top surfaces of the active regions of the substrate.

20 Claims, 9 Drawing Sheets

(56) References Cited

U.S. PATENT DOCUMENTS

| | | | |
|---|---|---|---|
| 2013/0105912 A1* | 5/2013 | Hsu | H01L 27/0629 257/379 |
| 2015/0097266 A1* | 4/2015 | Li | H01L 23/5256 257/529 |
| 2016/0049367 A1 | 2/2016 | Rou | |

* cited by examiner

SEMICONDUCTOR STRUCTURE AND METHOD OF FORMING THE SAME

BACKGROUND OF THE INVENTION

Field of Invention

The present invention is related to an integrated circuit and a method of forming the same, and more generally to a semiconductor structure including a fuse and a method of forming the same.

Description of Related Art

As integrated circuits become smaller and more complex, semiconductor components are more easily influenced by defects or impurities. Fuses are generally applied to redundancy circuits in the integrated circuits. Once defects are detected in the circuits, these fuses are used to trim or replace the defective parts of the circuits.

For example, fuses are usually included in a memory device. If some memory cells or word lines fail, the fuses may be used to disconnect the failed parts, and some redundant memory cells or redundant word lines may replace the failed parts. In addition, some fuse designs can even provide the programming function. However, some fuses may not be easily blown out as desired.

SUMMARY OF THE INVENTION

Accordingly, the present invention provides a semiconductor structure, in which a fuse is provided with a thin thickness and is easily blown out as needed.

The present invention provides a method of forming a semiconductor structure, in which no extra mask is required to form a thin fuse, so the process cost is significantly reduced.

The present invention provides a semiconductor structure including a substrate, an isolation structure, a fuse and two gate electrodes. The isolation structure is located in the substrate and defines active regions of the substrate. The fuse is disposed on the isolation structure. The gate electrodes are disposed on the active regions and connected to ends of the fuse. In an embodiment, a portion of a bottom surface of the fuse is lower than top surfaces of the active regions of the substrate.

According to an embodiment of the present invention, a top surface of the isolation structure is concavely recessed toward a bottom surface of the substrate.

According to an embodiment of the present invention, a first height of the isolation structure along a center line thereof is less than a second height of the isolation structure contacting the active regions.

According to an embodiment of the present invention, the fuse is conformal with the isolation structure.

According to an embodiment of the present invention, a top surface of the isolation structure is convex with respect to a bottom surface of the substrate.

According to an embodiment of the present invention, a top surface of the isolation structure is substantially flat.

According to an embodiment of the present invention, a thickness of the fuse ranges from about 100 angstroms to 850 angstroms.

According to an embodiment of the present invention, a ratio of the thickness of the fuse to a thickness of the adjacent gate electrode ranges from about 1/10 to 1/20.

According to an embodiment of the present invention, the isolation structure is located in a memory region of a memory device.

According to an embodiment of the present invention, the semiconductor structure further includes another isolation structure in a logic region thereof, the first height of the isolation structure is less than a third height of the another isolation structure along a center line thereof.

The present invention provides a method of forming a semiconductor structure that includes the following steps. An isolation structure is formed in a substrate and defines active regions of the substrate. A portion of the isolation structure is removed. A target layer is formed on the active regions and the isolation structure. The target layer on the isolation structure is partially removed.

According to an embodiment of the present invention, the removing the portion of the isolation structure includes performing a doping process on the isolation structure, and performing a cleaning process to remove the portion of the isolation structure.

According to an embodiment of the present invention, the performing the doping process further includes doping the active regions of the substrate.

According to an embodiment of the present invention, the partially removing the target layer on the isolation structure includes forming a first hard mask layer and a second hard mask layer on the target layer, performing a first etching process to remove a portion of the second hard mask layer over the isolation structure by using the first hard mask layer as an etching stop layer, and performing a second etching process to remove another portion of the second hard mask layer, a portion of the first hard mask layer and a portion of the target layer.

According to an embodiment of the present invention, an etchant used in the first etching process includes s a halogen-containing gas, an oxide-containing gas or a combination thereof, and an etchant used in the second etching process includes a halogen-containing gas, an oxide-containing gas or a combination thereof.

According to an embodiment of the present invention, the method further includes forming a third hard mask layer on the second hard mask layer, and the third hard mask layer is formed over the active regions of the substrate and exposes the second hard mask layer on the isolation structure.

According to an embodiment of the present invention, the forming the target layer includes forming a first conductive layer, forming an etching stop layer on the first conductive layer, and forming a second conductive layer on the etching stop layer.

According to an embodiment of the present invention, the partially removing the target layer includes removing the second conductive layer by using the etching stop layer as a stop layer, and removing the etching stop layer.

In view of the above, in the present invention, a thin fuse can be manufactured by the existing processes without an extra mask, and such thin fuse can be easily blown out as needed. Therefore, the production cost can be significantly reduced, and the competitive advantage can be easily achieved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1I are schematic cross-sectional views of a method of forming a semiconductor structure according to an embodiment of the present invention.

Figure 1A:
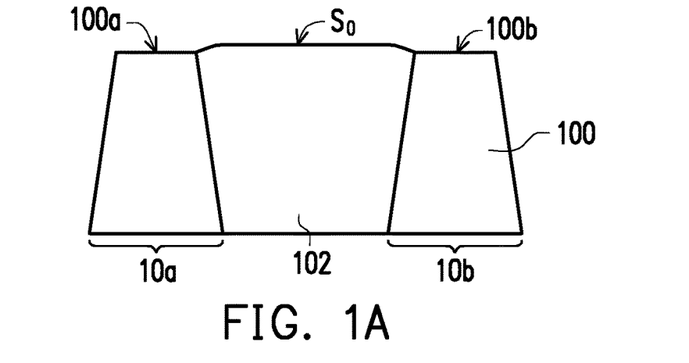
FIG. 1A to FIG. 1I are schematic cross-sectional views of a method of forming a semiconductor structure according to an embodiment of the present invention.

Referring to FIG. 1A, an isolation structure 102 is formed in a substrate 100, and the isolation structure 102 defines active regions 10a and 10b of the substrate 100. In an embodiment, the isolation structure 102 is a shallow trench isolation (STI) structure, and the forming method thereof includes the following steps. A hard mask structure (not shown) including a pad oxide layer and a pad nitride layer is formed on the substrate 10. An etching process is performed to partially remove the substrate 100 by using the hard mask structure as an etching mask and therefore form a trench in the substrate 100. Thereafter, an isolation structure 102 is formed in the trench, and the hard mask structure is then removed. In an embodiment, upon the removal of the hard mask structure, the surface S0 of the isolation structure is concave with respect to the top surfaces 100a and 100b of the active regions 10a and 10b. Specifically, a portion of the surface S0 of the isolation structure 102 is higher than the top surfaces 100a and 100b of the active regions 10a and 10b. In an embodiment, the isolation structure 102 includes oxide and has a single-layer or multi-layer structure. In an embodiment, diffusion regions or doped regions (not shown) are formed respectively in the active regions 10a and 10b of the substrate 100.

Figure 1B:
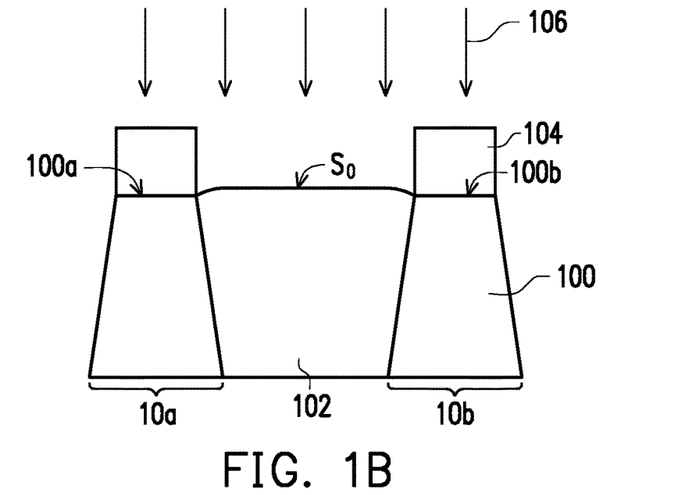
Figure 1C:
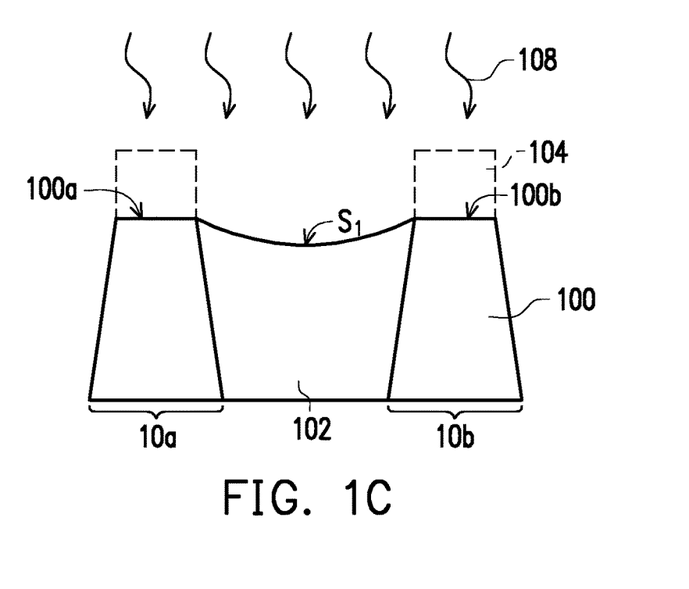

Referring to FIG. 1B to FIG. 1C, a portion of the isolation structure 102 is removed. The removal step may be implemented by a doping process and followed by a cleaning process.

As shown in FIG. 1B, a doping process 106 is performed on the isolation structure 102. In an embodiment, a photoresist layer 104 is formed on the substrate 100 and exposes the isolation structure 102. In an embodiment, the doping process 106 further includes doping the active regions 10a and 10b of the substrate 100. The doping process 106 may be configured to adjust a threshold voltage (Vt) of a device, and doped regions (not shown in this cross-section) are formed in the active regions 10a and 10b.

As shown in FIG. 1C, a cleaning process 108 is performed to remove the photoresist layer 104 and a surface portion of the isolation structure 102. The surface portion of the isolation structure 102 is damaged by the doping process 106 and is easily removed during the subsequent cleaning process 108. The cleaning process 108 includes using a cleaning solution that includes CAROZ, RCA1, diluted hydrofluoric acid or a combination thereof. In an embodiment, the CAROZ solution includes sulfuric acid and hydrogen peroxide, and the RCA1 solution includes ammonium hydroxide, hydrogen peroxide and deionized water. In an embodiment, upon the cleaning process 108, the top surface S1 of the isolation structure 102 is recessed and a portion of the top surface S1 of the isolation structure 102 is lower than the top surfaces 100a and 100b of the active regions 10a and 10b.

Figure 1D:
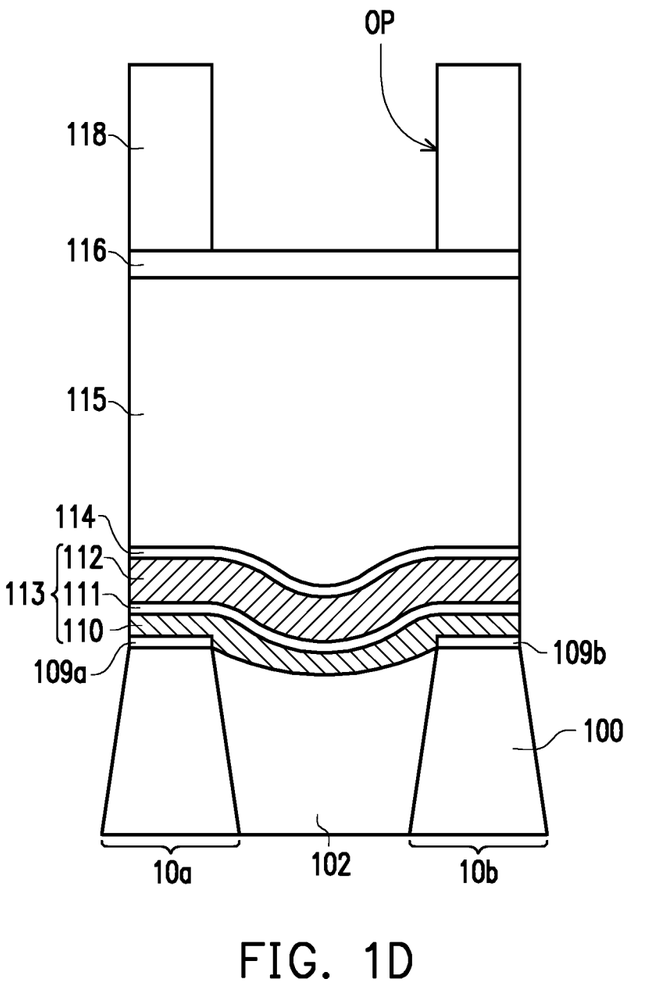

Referring to FIG. 1D, a target layer 113 is formed on the active regions 10a and 10b and the isolation structure 102. In some embodiment, insulating layers 109a and 109b are respectively formed on the surfaces of the active regions 10a and 10b before the formation of the target layer 113. The insulating layers 109a and 109b include oxide and may be formed by an oxidation process. In an embodiment, the target layer 113 is a multi-layer structure including a first conductive layer 110, an etching stop layer 111 and a second conductive layer 112. In an embodiment, the first conductive layer 110 includes doped polysilicon, the etching stop layer 111 includes an oxide-nitride-oxide (ONO) composite material, and the second conductive layer 112 includes doped polysilicon. The doping type of the first conductive layer 110 may be the same as or different from that of the second conductive layer 112. In an embodiment, the method of forming the target layer 113 includes forming a first conductive layer 110, forming an etching stop layer 111 on the first conductive layer 110, and forming a second conductive layer 112 on the etching stop layer 110 by performing multiple deposition processes. In an embodiment, the target layer 113 has a thickness of about 700-900 angstroms.

Referring to FIG. 1D to FIG. 1H, the target layer 113 on the isolation structure 102 are partially removed. The partial removal step includes performing multiple pattern transfer processes.

As shown in FIG. 1D, a first hard mask layer 114 and a second hard mask layer 115 are formed on the target layer 113. In an embodiment, the first hard mask layer 114 includes silicon nitride and may be formed by a deposition process. In an embodiment, the second hard mask layer 115 includes a bottom anti-reflection coating (BARC) layer or an organic dielectric layer (ODL) and may be formed by a spin-on coating. In an embodiment, the second hard mask layer 115 is an I-line layer or a 365 nm photoresist layer that is reactive to 365 nm wavelength light.

In an embodiment, a third hard mask layer 116 and a photoresist layer 118 are sequentially formed on the second hard mask layer 115. In an embodiment, the third hard mask layer 116 includes a silicon-containing hard-mask bottom anti-reflection coating (SHB) layer and may be formed by a spin-on coating. In an embodiment, the photoresist layer 118 is a 193 nm photoresist layer that is reactive to 193 nm wavelength light. The photoresist layer 118 has an opening pattern OP that exposes a portion of the third hard mask layer 116.

In an embodiment, the first hard mask layer 114 has a thickness of about 90-150 angstroms, the second hard mask layer 115 has a thickness of about 1300-1700 angstroms, the third hard mask layer 116 has a thickness of about 200-400 angstroms, and the photoresist layer 118 has a thickness of about 1000-1400 angstroms, but the present invention is not limited thereto.

Figure 1E:
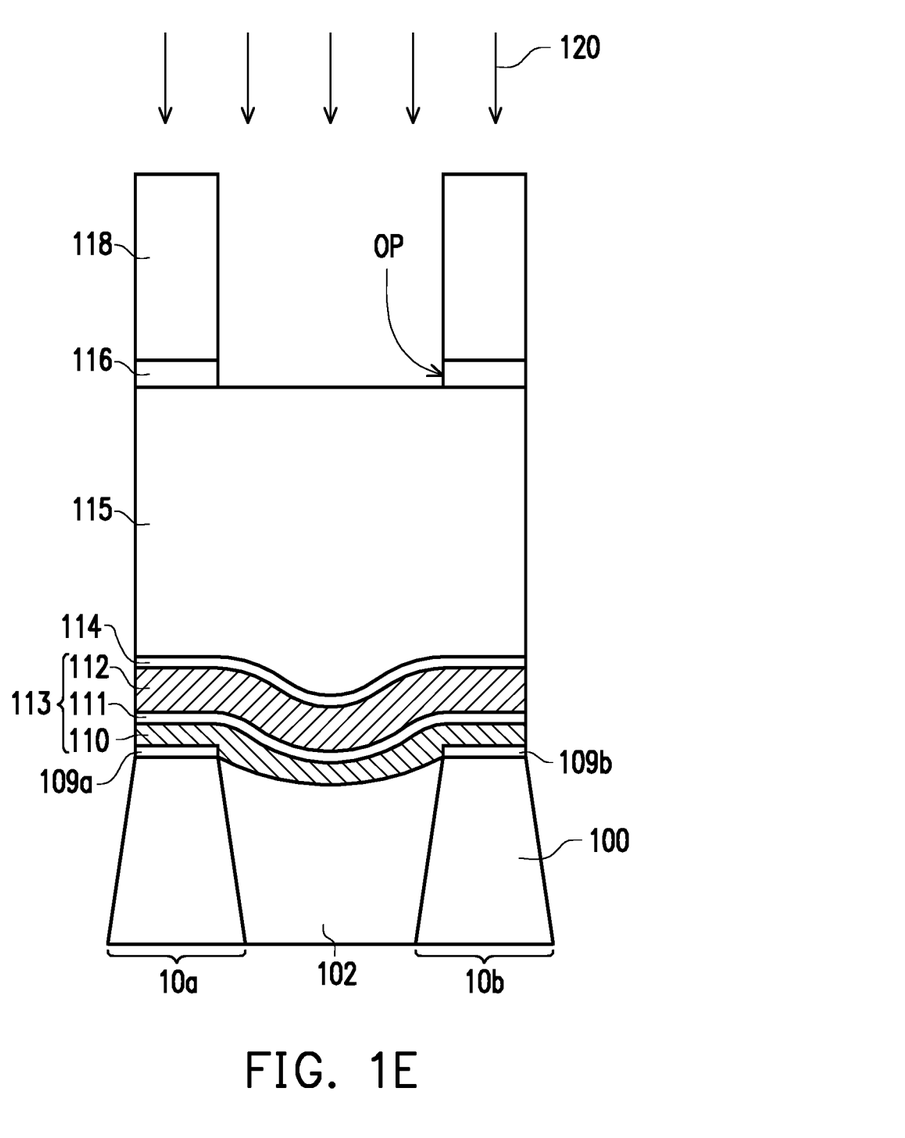

As shown in FIG. 1E, a pre-treatment 120 is performed to remove a portion of the third hard mask layer 116. Specifically, the opening pattern OP of the photoresist layer 118 is transferred to the third hard mask layer 116, so the third hard mask layer 116a is formed over the active regions 10a and 10b of the substrate 100 and exposes the second hard mask layer 115 on the isolation structure 102. The pre-treatment 120 may include a dry etching process.

Figure 1F:
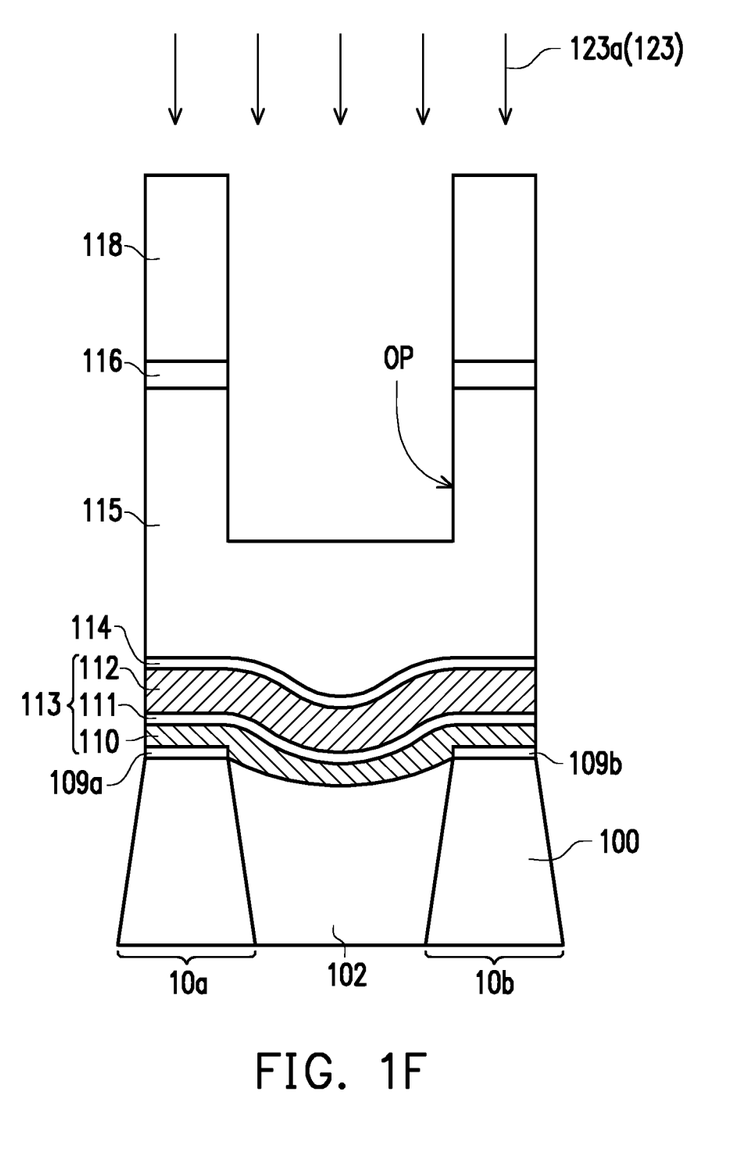
Figure 1G:
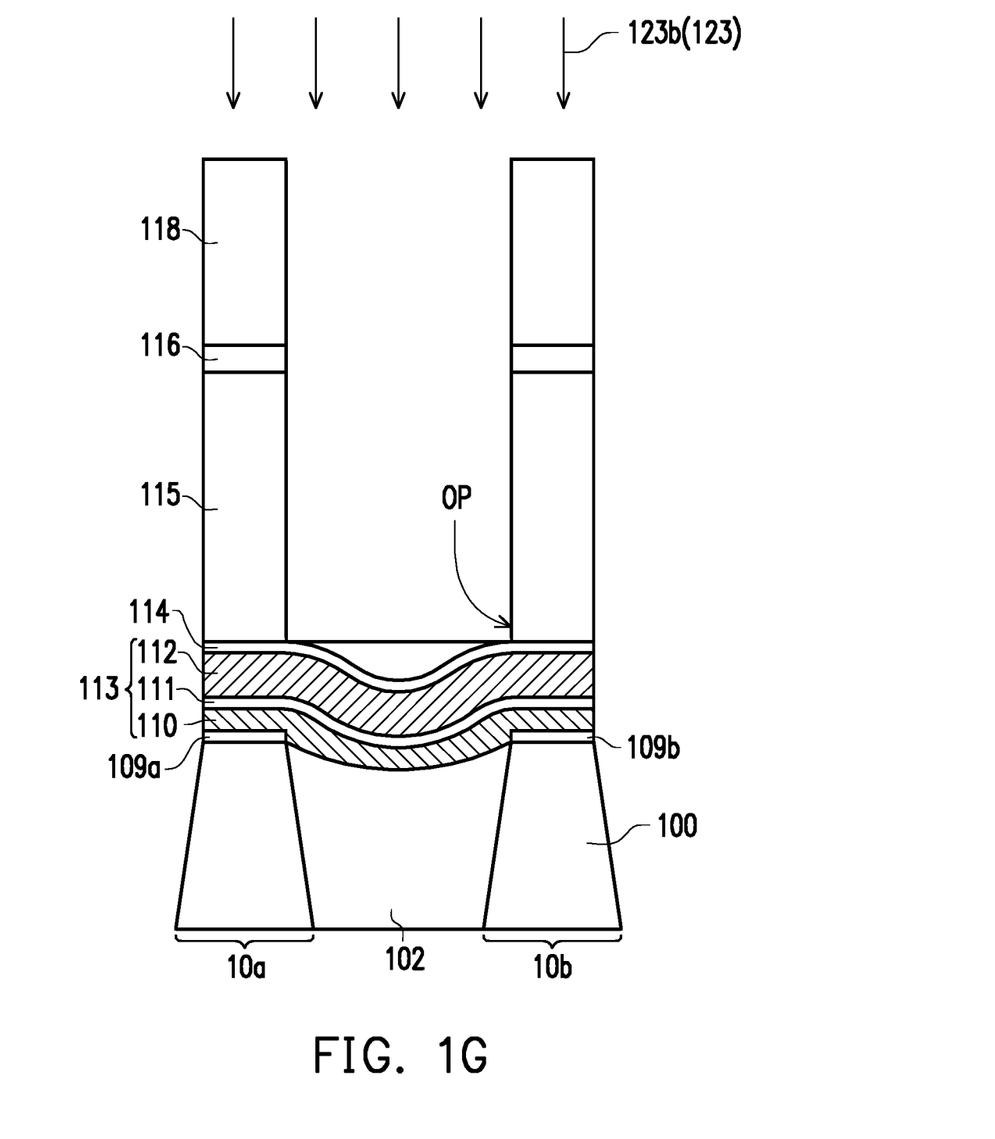

As shown in FIG. 1F and FIG. 1G, a first etching process 123 is performed to remove a portion of the second hard mask layer 115 over the isolation structure 102 by using the first hard mask layer 114 as an etching stop layer. The first etching process 123 may include a two-step dry etching process. In an embodiment, an etchant used in the first etching process 123 includes a halogen-containing gas, an oxide-containing gas or a combination thereof. For example, the etchant used in the first etching process 123 includes HBr, $Cl_2$, $N_2$, $O_2$, He or a combination thereof.

In an embodiment, as shown in FIG. 1F, a first step 123a of the first etching process 123 is performed to remove a portion of the second hard mask layer 115. Specifically, the opening pattern OP of the third hard mask layer 116 is transferred to an upper part of the second hard mask layer 115. In an embodiment, as shown in FIG. 1G, a second step 123b of the first etching process 123 is performed to remove another portion of the second hard mask layer 115. Specifically, the opening pattern OP of the third hard mask layer 116 is transferred to a lower part of the second hard mask layer 115, until the opening pattern OP reaches the first hard mask layer 114.

Figure 1H:
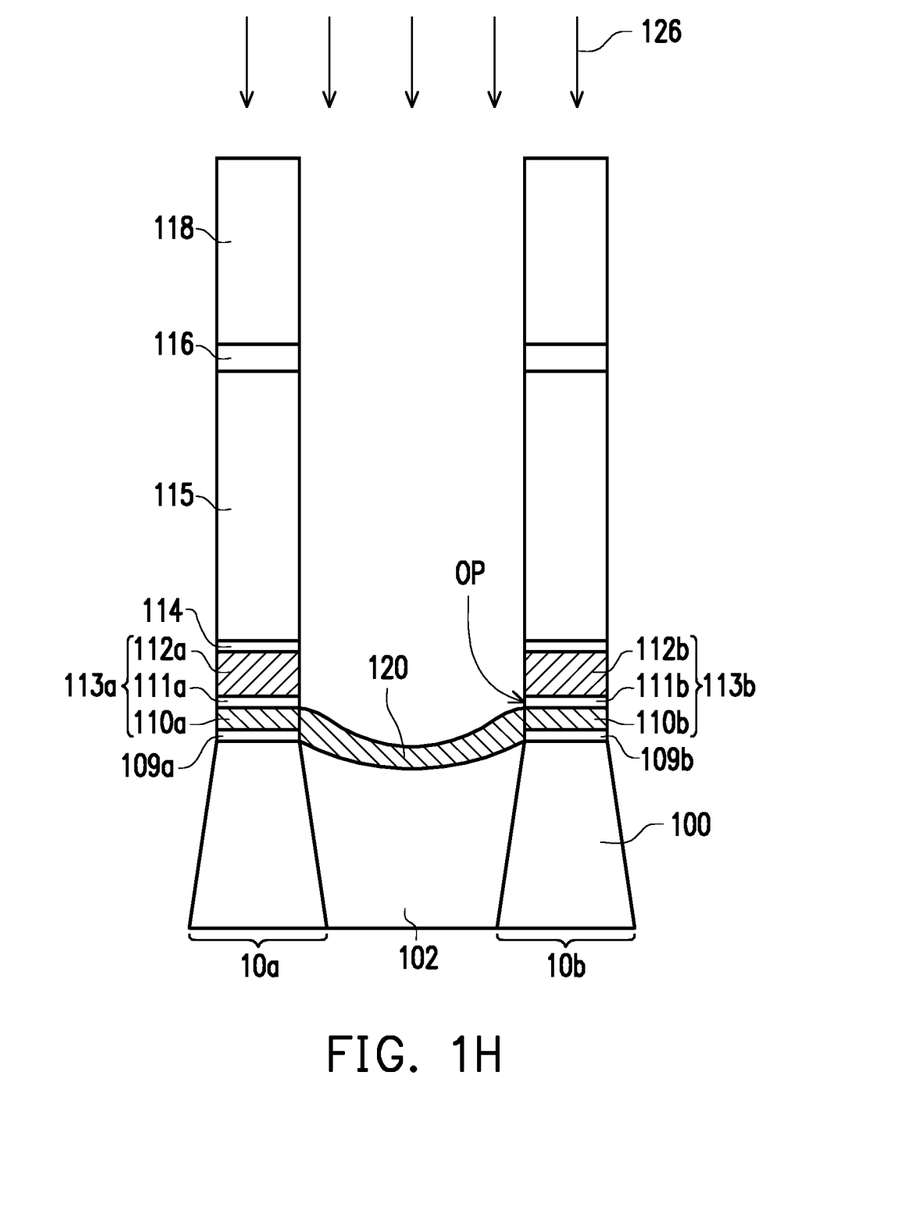

Referring to FIG. 1H, a second etching process 126 is performed to remove another portion of the second hard mask layer 115, a portion of the first hard mask layer 114 and a portion of the target layer 113 on the isolation structure 102. In an embodiment, an etchant used in the second etching process 126 includes a halogen-containing gas, an oxide-containing gas or a combination thereof. For example, the etchant used in the second etching process 126 includes HBr, $CF_4$, $Cl_2$, $N_2$, $O_2$, He or a combination thereof. Specifically, the opening pattern OP of the second hard mask layer 115 is transferred to the first hard mask layer 114 and then an upper part (e.g., etching stop layer 111) the of the target layer 113. More specifically, the partial removal of the target layer 113 includes removing the second conductive layer 112 by using the etching stop layer 111 as a stop layer, and removing the etching stop layer 111. A portion of the target layer 113 remained on the isolation structure 102 serves as a fuse 120, and another portion of the target layer 113 remained on the active regions 10a and 10b serves as gate electrodes 113a and 113b. In an embodiment, the fuse 120 is electrically connected to the gate electrodes 113a and 113b at two sides thereof. In an embodiment, the central thickness is less than the edge thickness of the fuse 120.

Figure 1I:
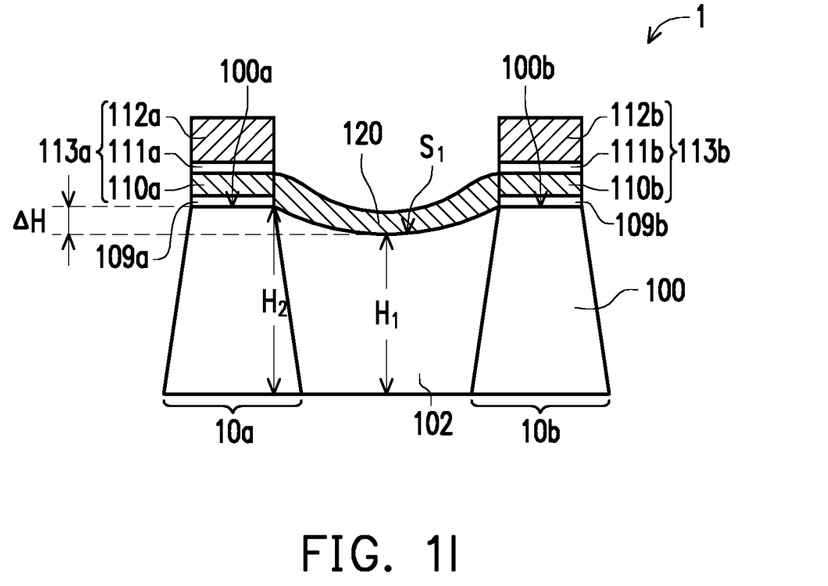

Referring to FIG. 1I, the first hard mask layer 114, the second hard mask layer 115, the third hard mask 116 and the photoresist layer 118 are removed. The removal step includes performing one or more etching processes. Thereafter, lightly doped regions, spacers and heavily doped regions (not shown in this cross-section) are formed aside the gate electrodes 113a and 113b. In an embodiment, lightly doped regions are formed in the substrate 100 aside the gate electrodes 113a and 113b, spacers are formed on the sidewalls of the gate electrodes 113a and 113b, and heavily doped regions are formed in the substrate 100 aside the spacers. A semiconductor structure 1 is thus completed.

The above embodiment in which the isolation structure 102 has a recessed top surface S1 is provided for illustration purposes, and is not construed as limiting the present invention. In another embodiment, the isolation structure 102 can be configured to have a convex top surface S2, and a fuse 121 is formed on the convex top surface S2 of the isolation structure 102, as shown in a semiconductor structure 2 of FIG. 2. In yet another embodiment, the isolation structure 102 can be configured to have a substantially flat top surface S3, and a fuse 122 is formed on the substantially flat top surface S3 of the isolation structure 102, as shown in a semiconductor structure 3 of FIG. 3. In an embodiment, the central thickness is less than the edge thickness of the fuse 121 or 122.

The semiconductor structures of the present invention are illustrated below with reference to FIG. 1I and FIG. 2 to FIG. 4.

The semiconductor structure 1/2/3/4 includes a substrate 100, an isolation structure located 102, a fuse 120/121/122 and two gate electrodes 113a and 113b. The isolation structure 102 is located in the substrate 100 and defines active regions 10a and 10b of the substrate 100. The fuse 120/121/122 is disposed on the isolation structure 102. Two gate electrodes 113a and 113b are disposed on the active regions 10a and 10b and connected to ends of the fuse 120/121/122. In an embodiment, a portion of a bottom surface of the fuse 120/121/122 is lower than top surfaces 100a and 100b of the active regions 10a and 10b of the substrate 100.

In an embodiment, the gate electrode 113a includes, from bottom to top, an insulating layer 109a as a tunnel layer, a first conductive layer 110a as a floating gate, an etching stop layer 111a as an inter-gate dielectric layer, and a second conductive layer 112a as a control gate. Similarly, the gate electrode 113b includes, from bottom to top, an insulating layer 109b as a tunnel layer, a first conductive layer 110b as a floating gate, an etching stop layer 111b as an inter-gate dielectric layer, and a second conductive layer 112b as a control gate. However, the structures of gate electrodes are not limited by the present invention. In another embodiment, the gate electrode may include a charge storage layer and a control gate over the charge storage layer. In yet another embodiment, the gate electrode may be a logic gate electrode such as a polysilicon gate structure or a high-k metal gate structure.

In an embodiment, the fuse 120/121/122 is conformal with the isolation structure 102, and thus, the top surface of the isolation structure 102 and the bottom surface of the fuse 120/121/122 can be labelled with the same numerals.

In an embodiment, a top surface S1 of the isolation structure 102 is concavely recessed toward a bottom surface of the substrate 100, as shown in FIG. 1I. In an embodiment, a first height H1 of the isolation structure 102 along a center line thereof in a direction perpendicular to the top surface of the substrate 100 is less than a second height H2 of the isolation structure 102 contacting the active regions 10a and 10n. In an embodiment, the difference ΔH between the first height H1 and the second height H2 is from about 100 angstroms to 600 angstroms.

Figure 2:
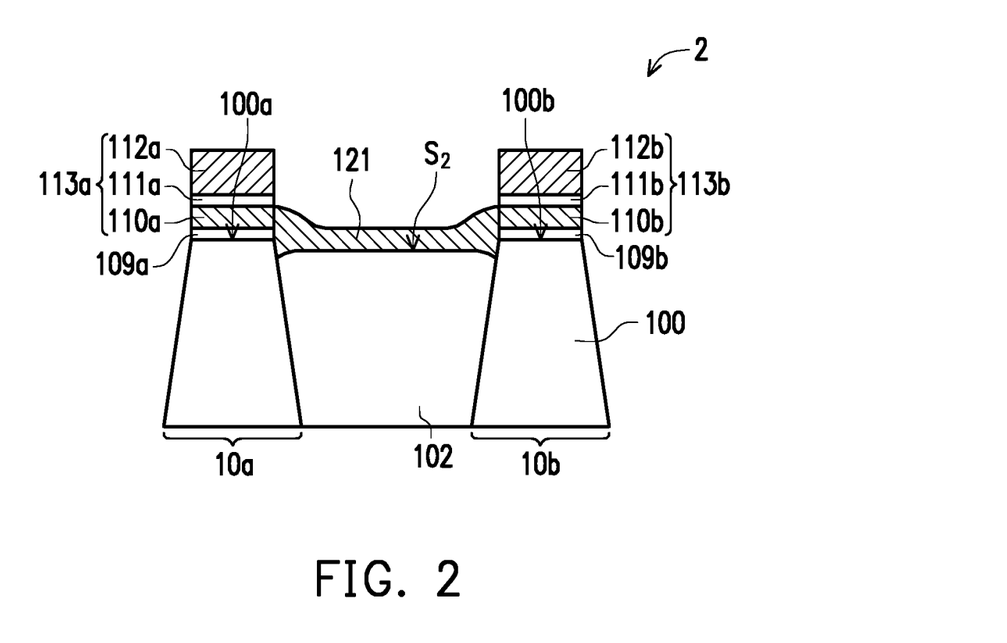
FIG. 2 is a schematic cross-sectional view of a semiconductor structure according to another embodiment of the present invention.
Figure 3:
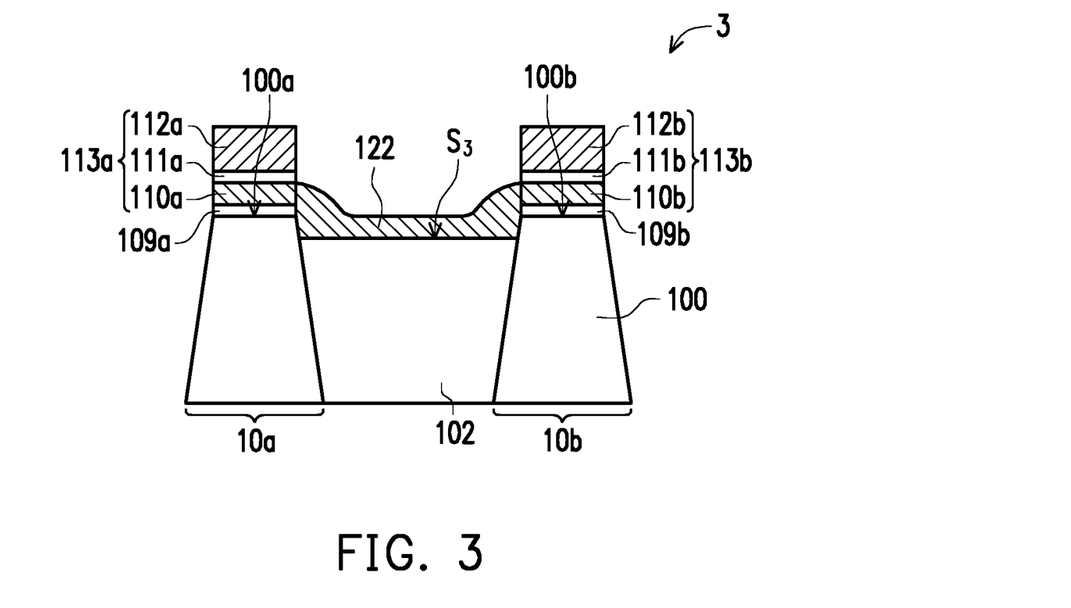
FIG. 3 is a schematic cross-sectional view of a semiconductor structure according to yet another embodiment of the present invention.

In an embodiment, a top surface S2 of the isolation structure 102 is convex with respect to the bottom surface of the substrate 100, as shown in FIG. 2. In an embodiment, a top surface S3 of the isolation structure 102 is substantially flat and parallel to the bottom surface of the substrate 100, as shown in FIG. 3.

In an embodiment, a thickness of the fuse 120/121/122 ranges from about 100 angstroms to 850 angstroms. In an embodiment, the ratio of a thickness of the fuse 120/121/122 to a thickness of the adjacent gate electrode 113a or 113b ranges from about 1/10 to 1/20.

Figure 4:
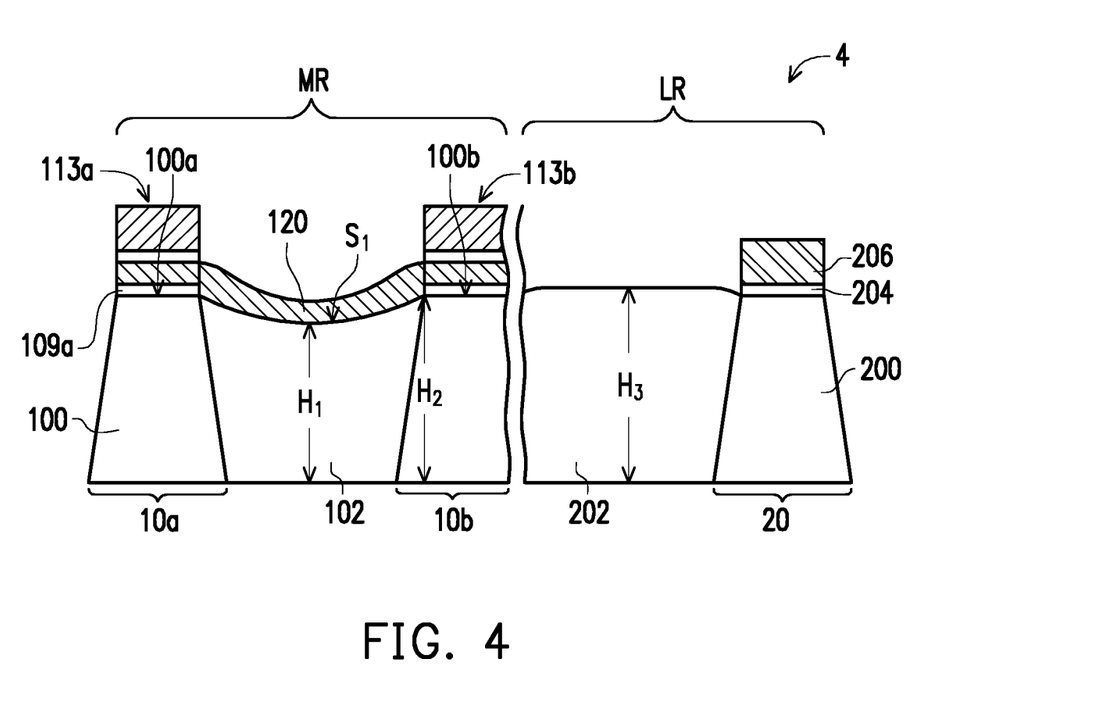
FIG. 4 is a schematic cross-sectional view of a semiconductor structure according to still another embodiment of the present invention.

In an embodiment, as shown in FIG. 4, the isolation structure 102 is located in a memory region MR of a memory device, and the semiconductor structure 4 further includes a second isolation structure 202 located in a logic region LR thereof. The first height H1 of the isolation structure 102 is less than a third height H3 of the second isolation structure 202 along a center line thereof in a direction perpendicular to the top surface of the substrate 100. In an embodiment, the isolation structure 202 are located in the substrate 200 and defines an active region 20 aside the isolation structure 202, and a gate dielectric layer 204 and a gate 206 are disposed on the substrate 200 in the active region 20.

Figure 5:
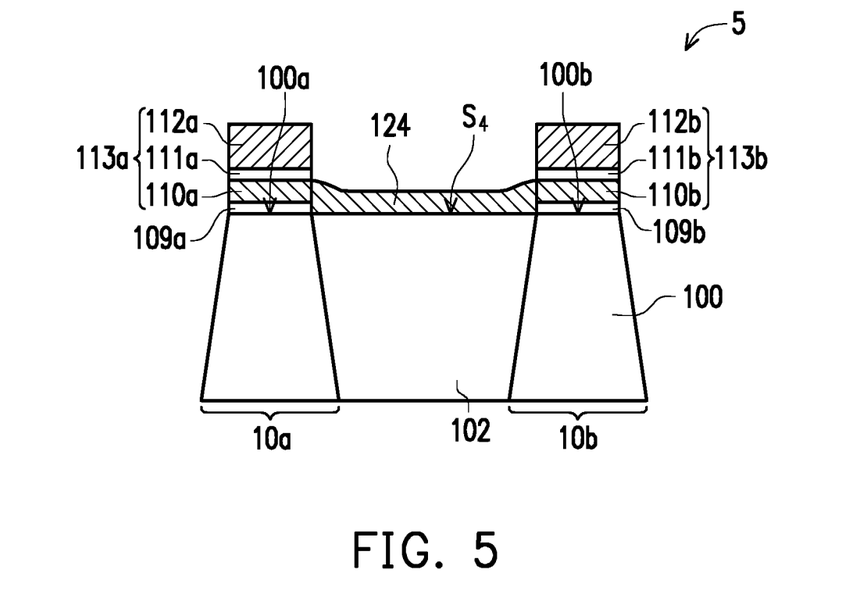
FIG. 5 to FIG. 6 are schematic cross-sectional views of semiconductor structures according to various embodiments of the present invention.
Figure 6:
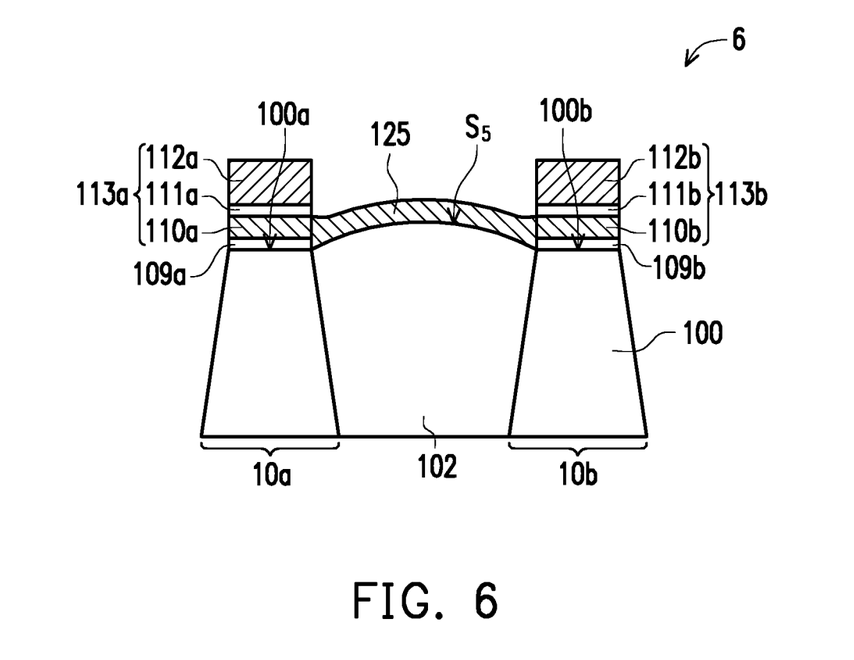

In the above embodiments, a portion of a bottom surface of the fuse is lower than a top surface of the adjacent active region of the substrate. However, the present invention is not limited thereto. In another embodiment, a portion of a bottom surface S4 of the fuse 124 is substantially coplanar with a top surface of the adjacent active region 10a or 10b of the substrate 100, as shown in a semiconductor structure 5 of FIG. 5. In yet another embodiment, a portion of a bottom surface S5 of the fuse 125 is higher than a top surface of the adjacent active region 10a or 10b of the substrate 100, as shown in a semiconductor structure 6 of FIG. 6. In an embodiment, the ratio of a thickness of the fuse 124/125 to a thickness of the adjacent gate electrode 113a or 113b ranges from about 1/10 to 1/20.

In summary, in the present invention, a thin fuse can be manufactured by the existing processes without an extra mask, and such thin fuse can be easily blown out as needed. Therefore, the production cost can be significantly reduced, and the competitive advantage can be easily achieved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor structure, comprising:
    a substrate;
    an isolation structure located in the substrate, defining active regions of the substrate;
    a fuse, disposed on the isolation structure; and
    two gate electrodes, disposed on the active regions and connected to ends of the fuse,
    wherein a portion of a bottom surface of the fuse is lower than top surfaces of the active regions of the substrate,
    wherein a top surface of the isolation structure is concavely recessed toward a bottom surface of the substrate.

2. The semiconductor structure of claim 1, wherein a first height of the isolation structure along a center line thereof is less than a second height of the isolation structure contacting the active regions.

3. The semiconductor structure of claim 1, wherein the fuse is conformal with the isolation structure.

4. A semiconductor structure, comprising:
    a substrate;
    an isolation structure located in the substrate, defining active regions of the substrate;
    a fuse, disposed on the isolation structure; and
    two gate electrodes, disposed on the active regions and connected to ends of the fuse,
    wherein a portion of a bottom surface of the fuse is lower than top surfaces of the active regions of the substrate,
    wherein a top surface of the isolation structure is convex with respect to a bottom surface of the substrate.

5. The semiconductor structure of claim 1, wherein a thickness of the fuse ranges from 100 angstroms to 850 angstroms.

6. The semiconductor structure of claim 1, wherein a ratio of the thickness of the fuse to a thickness of the adjacent gate electrode ranges from 1/10 to 1/20.

7. The semiconductor structure of claim 1, wherein the isolation structure is located in a memory region of a memory device.

8. The semiconductor structure of claim 7, further comprises another isolation structure located in a logic region thereof, a first height of the isolation structure is less than a third height of the another isolation structure along a center line thereof.

9. A method of forming a semiconductor structure, comprising:
    forming an isolation structure in a substrate, wherein the isolation structure defines active regions of the substrate;
    removing a portion of the isolation structure;
    forming a target layer on the active regions and the isolation structure; and
        partially removing the target layer on the isolation structure, and a portion of the target layer remained on the isolation structure serves as a fuse, another portion of target layer remained on the active regions serves as two gate electrodes, wherein the two gate electrodes are disposed on the active regions and connected to ends of the fuse,
    wherein a portion of a bottom surface of the fuse is lower than top surfaces of the active regions of the substrate,
    wherein a top surface of the isolation structure is concavely recessed toward a bottom surface of the substrate, or the top surface of the isolation structure is convex with respect to the bottom surface of the substrate.

10. The method of claim 9, wherein the removing the portion of the isolation structure comprises:
    performing a doping process on the isolation structure; and
    performing a cleaning process to remove the portion of the isolation structure.

11. The method of claim 10, wherein the performing the doping process further comprises doping the active regions of the substrate.

12. The method of claim 9, wherein the partially removing the target layer on the isolation structure comprises:
    forming a first hard mask layer and a second hard mask layer on the target layer;
    performing a first etching process to remove a portion of the second hard mask layer over the isolation structure by using the first hard mask layer as an etching stop layer; and
    performing a second etching process to remove another portion of the second hard mask layer, a portion of the first hard mask layer and a portion of the target layer.

13. The method of claim 12, wherein an etchant used in the first etching process comprises a halogen-containing gas, an oxide-containing gas or a combination thereof, and an etchant used in the second etching process comprises a halogen-containing gas, an oxide-containing gas or a combination thereof.

14. The method of claim 12, further comprises forming a third hard mask layer on the second hard mask layer, wherein the third hard mask layer is formed over the active regions of the substrate and exposes the second hard mask layer on the isolation structure.

15. The method of claim 9, wherein the forming the target layer comprises:
   forming a first conductive layer;
   forming an etching stop layer on the first conductive layer; and
   forming a second conductive layer on the etching stop layer.

16. The method of claim 15, wherein the partially removing the target layer comprises:
   removing the second conductive layer by using the etching stop layer as a stop layer; and
   removing the etching stop layer.

17. The semiconductor structure of claim 4, wherein the fuse is conformal with the isolation structure.

18. The semiconductor of claim 4, wherein a thickness of the fuse ranges from 100 angstroms to 850 angstroms.

19. The semiconductor of claim 4, wherein a ratio of the thickness of the fuse to a thickness of the adjacent gate electrode ranges from 1/10 to 1/20.

20. The semiconductor of claim 4, wherein the isolation structure is located in a memory region of a memory device.

* * * * *